United States Patent [19]
Maki

[11] Patent Number: 5,124,796
[45] Date of Patent: Jun. 23, 1992

[54] CHARGE COUPLED DEVICE HAVING A CIRCUIT FOR HANDLING A FUNDAMENTAL CLOCK SIGNAL

[75] Inventor: Yasuhito Maki, Kanagawa, Japan

[73] Assignee: Sony Corporation, Tokyo, Japan

[21] Appl. No.: 577,000

[22] Filed: Sep. 4, 1990

[30] Foreign Application Priority Data

Sep. 6, 1989 [JP] Japan .................. 1-229398

[51] Int. Cl.⁵ .................. H04N 3/14; H04N 5/335
[52] U.S. Cl. .................. 358/213.11; 307/607
[58] Field of Search .................. 358/213.11, 21 R; 333/165, 166, 138; 307/607; 377/57, 62, 63

[56] References Cited

U.S. PATENT DOCUMENTS 4,091,342 5/1978 Whitten .................. 307/607
4,228,460 10/1980 Rotter .
4,271,366 6/1981 Isayama et al. .................. 307/607
4,802,000 1/1989 Willis .................. 358/31

FOREIGN PATENT DOCUMENTS 0255125 2/1988 European Pat. Off. .
02828279 9/1988 European Pat. Off. .

Primary Examiner—David K. Moore
Assistant Examiner—Wendy R. Greening
Attorney, Agent, or Firm—Hill, Van Santen, Steadman & Simpson

[57] ABSTRACT

A charge coupled device has a circuit for handling a fundamental clock signal to produce a particular driving signal in the device, and independent power supply lines and/or ground lines. One power supply line and/or one ground line is exclusive for the circuit for handling the fundamental clock signal. The interference by the fundamental clock signal is prevented by the separation of power supply line and/or ground line.

4 Claims, 1 Drawing Sheet

CHARGE COUPLED DEVICE HAVING A CIRCUIT FOR HANDLING A FUNDAMENTAL CLOCK SIGNAL

BACKGROUND OF THE INVENTION

1. Field of the Invention

This invention relates to a charge coupled device, in particular, to a charge coupled device such as a CCD delay line for producing signals by using a fundamental clock signal.

2. Description of the Prior Art

Recent CCD delay lines include therein many peripheral circuits from a viewpoint of easiness of use. Especially, in the case of a video signal processing, etc., about 5 MHz is required as the signal band. Accordingly, a frequency of 2 to 6 fsc (color subcarrier frequency) is used as the drive frequency for CCD delay lines.

In order to provide a clock frequency of 2 to 6 fsc, it is necessary to use a PLL (Phase-Locked Loop) circuit. Accordingly, an employment of other ICs results in an increased cost and an increased number of parts of the entirety. In view of this, CCD delay line including a PLL circuit on the same chip are being developed.

In a CCD delay line including therein a PLL circuit, a clock having a frequency of fsc is supplied to the PLL circuit as an external clock signal in order to activate the delay line. However, this signal of fsc component may leak into other circuits inside the CCD delay line. Thus, a bad influence may occur by that false signal. For example, in the case where there has been leakage of a signal of fsc component when a monochromatic picture should be monitored, the signal of fsc component is superimposed on an original signal. As a result, such a signal component is judged to be a color component on a monitor, and a color is produced on the monochromatic picture.

SUMMARY OF THE INVENTION

It is the object of this invention to provide an improved charge coupled device which is adapted to prevent the including circuitry of the device from leakage of a clock signal supplied to the device.

According to one embodiment of the invention, a charge coupled device includes independent power supply lines and/or independent ground lines among circuit sections for handling the fundamental clocks signals and the other circuit sections. Owing to the independent power supply lines and/or ground lines, the path of leakage is shut down.

DETAILED DESCRIPTION OF THE PREFERRED EMBODIMENT

A preferred embodiment of this invention will now be described with reference to the attached drawings.

This embodiment is directed to the example of a CCD delay line, which is of a structure in which a clock signal of fsc is inputted as a fundamental clock signal from the external. The CCD delay line, and the circuit for handling the fundamental clock signal, are formed on semiconductor substrate 35 (FIG. 1).

Figure 1:
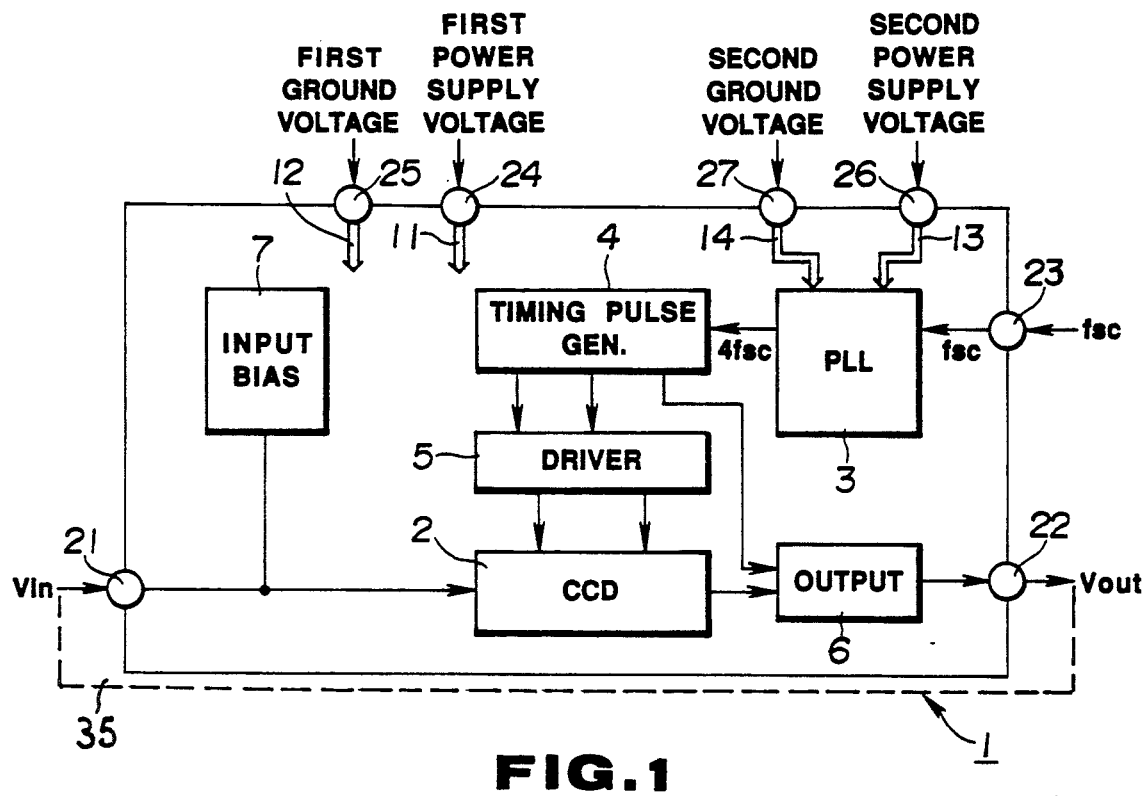
FIG. 1 is a block diagram of an embodiment of a CCD according to this invention.

Preferably, the components of FIG. 1 are all formed on a semiconductor substrate 35, indicated by a dashed line rectangle.

Its circuit configuration is shown in a block form in FIG. 1. The CCD delay line 1 of this embodiment is a device for providing a delay of one line of the NTSC system, and has a CMOS configuration. An input signal Vin biased by an input bias circuit 7 is inputted from a terminal 21 to a CCD section 2 comprised of charge coupled devices. This input signal Vin is delayed by about 1H (horizontal line) at the CCD section 2. An outputs signal Vout thus delayed is outputted from a terminal 22 through an output circuit 6. This output signal Vout is used for a required signal processing. This CCD delay line 1 is provided with a driver 5 for driving the CCD section 2. Further, a timing pulse generator 4 for supporting a drive signal to the driver 5 is provided. The timing pulse generator 4 transmits a required pulse also to the output circuit 6.

A clock signal 4fsc of a color subcarrier frequency multiplied by four is supplied from a PLL circuit 3 to the timing pulse generator 4. The PLL circuit 3 is inputted, through a terminal 23, a clock signal fsc (3.58 MHz) which is a fundamental clock signal from the external to generate a clock signal 4fsc multiplied by four on the basis of this clock signal fsc.

The CCD delay line 1 of this embodiment having a configuration as shown in such a block form is characterized in the power supply line and the ground line. Namely, the CCD delay line of this embodiment includes two systems of power supply lines 11 and 13, and ground line 12 and 14. Particularly, that CCD delay line includes power supply line 13 and ground line 14 exclusive for the PLL circuit 3. A second power supply voltage is supplied to the power supply line 13 exclusive for the PLL circuit 3 through a terminal 26. Further, a second ground voltage is supplied to the ground line 14 exclusive for the PLL circuit 3 through a terminal 27. These power supply line 13 and ground line 14 are defined as a pattern which is drawn around within the region of the PLL circuit 3, but does not extend to other circuit sections. The power supply line 11 and the ground line 12 of the other system are those for other circuit sections. A first power supply voltage is supplied to the power supply line 11 through a terminal 24, and a first ground voltage is supplied to the ground line 12 through a terminal 25. Here, other circuit sections are timing pulse generator 4, driver 5, CCD section 2, output circuit 6, and input bias circuit 7. Although not shown, the power supply line 11 and the ground line 12 are wired to respective circuit sections. In this embodiment, as stated above, the power supply lines 11 and 13 and the ground lines 12 and 14 are of a structure of two systems such that ones are exclusive for the PLL circuit 3 and others are other circuit sections. Thus, an undesired phenomenon such that a fsc component leaks in a pulse signal for driving CCD or a sampling signal is suppressed, and a bad influence such that a signal is modulated by the fsc component at the output circuit 6 is prevented. Further, in this embodiment, only the patterns are not separated from each other, but two systems are provided to as to separately include respective external terminals. As stated above, by allowing external terminals 26 and 27 to be exclusive, leakage of a fsc component particularly from the PLL circuit 3 can be held down to a smaller value. It is to be noted that the power supply line 11 is not necessarily required to be for supplying one kind of a voltage, but may be for supplying many kinds of voltages, e.g., 5 volts and 9 volts.

Figure 2:
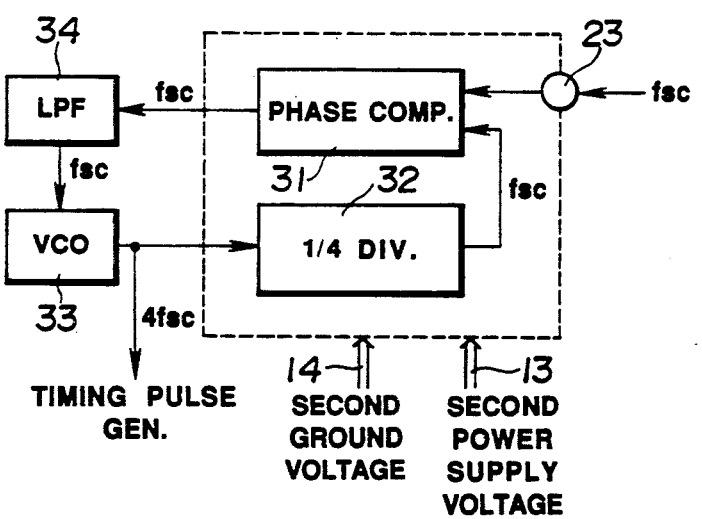
FIG. 2 is a block diagram showing the configuration of the PLL circuit in the embodiment.

FIG. 2 shows, in a blank form, the configuration of the PLL circuit of the CCD delay line of this embodiment. This PLL circuit includes a phase comparator 31, a voltage controlled oscillator 33, and a ¼ frequency divider 32, wherein a low-pass filter 34 is externally provided. In this PLL circuit, a signal fsc which is a fundamental clock signal is supplied from the external through one input terminal 23 to the phase comparator 31. An output from the phase comparator 31 is supplied to the voltage controlled oscillator 33 through the low-pass filter 34, at which this output is multiplied by four. The signal 4fsc thus obtained from the voltage controlled oscillator 33 is supplied to the timing pulse generator 4 and is also supplied to the ¼ frequency divider 32. At the ¼ frequency divider 32, the signal 4fsc is divided by four, so it is changed back to the fundamental signal fsc. This fundamental signal fsc is inputted to the other input terminal of the phase comparator 31. In this PLL circuit, the phase comparator 31 and the ¼ frequency divider 32 is of a CMOS structure. The signal fsc which is the fundamental clock signal is dealt by the phase comparator 31 and the ¼ frequency divider 32 which are encompassed by broken lines in the figure. In the CCD delay line of this embodiment, the power supply line 13 and the ground line 14 which are independent of other circuit sections are used exclusively for the phase comparator 31 and the ¼ frequency divider 32. As stated above, by allowing the power supply line 13 and the ground line 14 for the phase comparator 31 and the ¼ frequency divider 32 which handle the signal fsc to be exclusive, superposition on the output signal Vout of the signal fsc of a color subcarrier frequency is suppressed. Accordingly, a signal delayed by 1H having a small false signal component is provided. In the case of on chip implementation of the low-pass filter 34, a power supply line and a ground line for the low-pass filter 34 may be formed by elongating the power supply line and the ground line used for the phase comparator 31 and the ¼ frequency divider 32.

Preferably, the components of FIG. 1 are all formed on a semiconductor substrate 35, indicated by a dashed line rectangle.

It is to be noted that while the PLL circuit 3 is of a quadruple frequency structure in the above-described embodiment, this is not limited to such a structure, and the frequency divider having a ratio of frequency division more than ½ may be used. Further, while explanation has been made in connection with the example of the CCD delay line in the above-described embodiment, this invention may be also applied to a CCD image pickup element including its peripheral circuit on the same chip. In addition, while an arrangement such that both the power supply line and the ground line are independent may be employed in the above-described embodiment, an arrangement such that only one of them is exclusive may be employed.

What is claimed is:

1. A charge coupled device comprising:
  (a) a semiconductor substrate;
  (b) a charge coupled device section formed on the semiconductor substrate;
  (c) a circuit for handling a fundamental clock signal supplied from an external circuit, said handling circuit being formed on the semiconductor substrate;
  (d) a second circuit formed on the semiconductor substrate;
  (e) a first power supply line and/or a first ground line connected to the circuit for handling the fundamental clock signal; and
  (f) a second power supply line and/or a second ground line connected to said second circuit and not connected to the circuit for handling the fundamental clock signal.

2. The charge coupled device according to claim 1, wherein the charge coupled device section has an input terminal and an output terminal, and means for delaying a signal outputted from the output terminal with respect to the input signal at the input terminal.

3. The charge coupled device according to claim 1 or 2, wherein the circuit for handling a fundamental clock signal includes a phase locked loop.

4. The charge coupled device according to claim 3 wherein the fundamental clock signal is a color subcarrier signal of the television signal.

* * * * *